United States Patent
Kitagawa

(10) Patent No.: US 9,147,456 B2
(45) Date of Patent: Sep. 29, 2015

(54) MAGNETIC RANDOM ACCESS MEMORY USING MAGNETORESISTIVE ELEMENT, DIODE, AND TRANSISTOR

(75) Inventor: Eiji Kitagawa, Yokohama (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 257 days.

(21) Appl. No.: 13/537,947

(22) Filed: Jun. 29, 2012

(65) Prior Publication Data

US 2013/0077389 A1 Mar. 28, 2013

(30) Foreign Application Priority Data

Sep. 26, 2011 (JP) .................... 2011-209906

(51) Int. Cl.
*G11C 11/00* (2006.01)
*G11C 11/16* (2006.01)
*H01L 27/22* (2006.01)

(52) U.S. Cl.
CPC .............. *G11C 11/16* (2013.01); *H01L 27/222* (2013.01)

(58) Field of Classification Search
CPC ............................ G11C 11/16; H01L 27/222
USPC .................... 365/148, 158, 163, 171, 173
See application file for complete search history.

(56) References Cited

U.S. PATENT DOCUMENTS

| | | | |
|---|---|---|---|
| 6,649,953 B2 | 11/2003 | Cha | |
| 6,930,911 B2 * | 8/2005 | Ezaki et al. | 365/158 |
| 7,184,301 B2 * | 2/2007 | Sugibayashi et al. | 365/158 |
| 7,239,541 B2 | 7/2007 | Saito et al. | |
| 2005/0152178 A1 | 7/2005 | Katti | |

FOREIGN PATENT DOCUMENTS

| | | |
|---|---|---|
| CN | 1385905 A | 12/2002 |
| CN | 1811984 A | 8/2006 |
| JP | 2004-348934 | 12/2004 |

OTHER PUBLICATIONS

Office Action issued Jul. 18, 2013 in Korean Patent Application No. 10-2012-0067833 (with English translation).

Kangho Lee, et al., "Development of Embedded STT-MRAM for Mobile System-on-Chips", IEEE Transactions on Magnetics, vol. 47, No. 1, Jan. 2011, pp. 131-136.

(Continued)

*Primary Examiner* — Thao H Bui
(74) *Attorney, Agent, or Firm* — Oblon, McClelland, Maier & Neustadt, L.L.P.

(57) ABSTRACT

A magnetic memory according to an embodiment includes: a magnetoresistive element including a first magnetic layer having a magnetization direction not to be changed by spin-injection writing, a second magnetic layer having a magnetization direction to be changeable by the spin-injection writing, and a tunnel barrier layer provided between the first and second magnetic layers; a first interconnect electrically connected to one of the first and second magnetic layers; a select transistor, with one of a source and drain thereof being electrically connected to the other one of the first and second magnetic layers; a second interconnect electrically connected to the other one of the source and drain; a diode having one terminal electrically connected to the other one of the first and second magnetic layers; a third interconnect electrically connected to the other terminal of the diode; and a sense amplifier electrically connected to the third interconnect.

9 Claims, 10 Drawing Sheets

(56) References Cited

OTHER PUBLICATIONS

Chinese Office Action dated Dec. 5, 2014, issued in Chinese Patent Application No. 201210223483.2 (with English translation).

Office Action issued Jan. 27, 2015 in Japanese Patent Application No. 2011-209906 (with English language translation).

* cited by examiner

MAGNETIC RANDOM ACCESS MEMORY USING MAGNETORESISTIVE ELEMENT, DIODE, AND TRANSISTOR

CROSS-REFERENCE TO RELATED APPLICATION

This application is based upon and claims the benefit of priority from prior Japanese Patent Application No. 2011-209906 filed on Sep. 26, 2011 in Japan, the entire contents of which are incorporated herein by reference.

FIELD

Embodiments described herein relate generally to magnetic random access memories using magnetoresistive elements, diodes, and transistors.

BACKGROUND

As the era of cloud computing has begun, there is an ever increasing need for higher-speed information processing to process enormously increasing amount of information. In the era of personal computers, users spent long periods of time to deal with too large amounts of information. In the world of cloud computing, however, information is processed in real time, and therefore, users cannot spend time to process information.

Meanwhile, in order to process information at high speeds, SRAMs (Static Random Access Memories) and MPUs (Micro-Processing Units) are used. In the world of cloud computing, however, data is transmitted to and received from mobile terminals, and enormous amounts of information are used in real time. Therefore, SRAMs and MPUs that continually consume electrical power have the problem of power consumptions. To compensate for the large amount of power consumptions, large batteries are necessary. This is far from portable access to information on a daily basis.

To reduce the consumptions of electrical power, the expectations for development of nonvolatile memories are growing, and such development is being accelerated around the world. Examples of such nonvolatile memories include MRAMs (Magnetic Random Access Memories), FeRAMs (Ferroelectric RAMs), PRAMs (Phase-change RAMs), and ReRAMs (Resistance-variable RAMs). Of those memories, only MRAMs can cope with a very large number of rewriting operations, and have high write and read speeds. In view of this, MRAMs have the potential to realize nonvolatile working memories.

However, the write time and the read time of a MRAM are both approximately ten times longer than the write time and the read time of a SRAM. In a MRAM, the write time can be shortened by increasing the write current, and the read time can be shortened by increasing the read resistance difference. In this manner, higher speeds can be achieved. That is, in order to enable higher-speed reading, larger read resistance differences have been expected.

To realize high-speed operations equivalent to a SRAM with a MRAM, read outputs of the MRAM need to be increased, and the write current needs to be reduced. However, read outputs cannot be increased more than about 200% by any existing technique, and information consisting of the data "1" and the data "0" cannot be read at the same speed as that of a SRAM.

DETAILED DESCRIPTION

Figure 1:
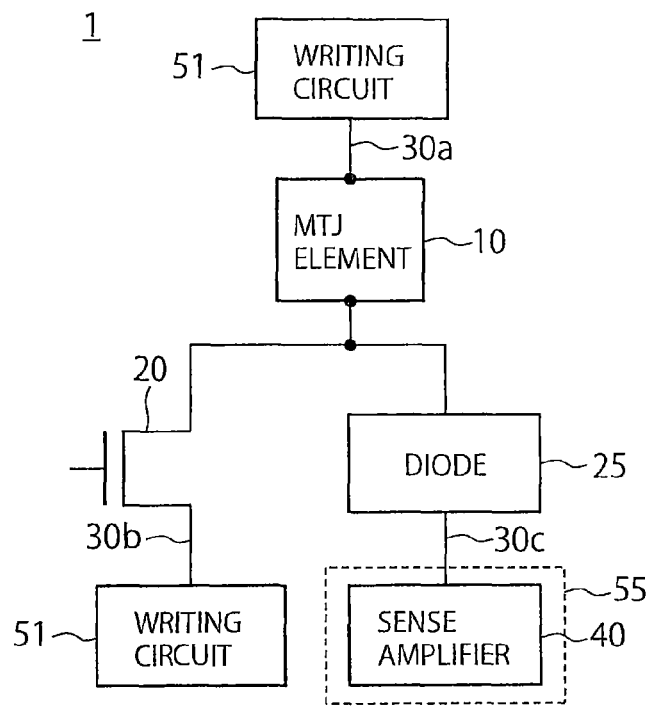
FIG. 1 is a diagram showing a memory cell of a MRAM according to a first embodiment.

A magnetic memory according to an embodiment includes: a magnetoresistive element including a first magnetic layer having a magnetization direction not to be changed by spin-injection writing, a second magnetic layer having a magnetization direction to be changeable by the spin-injection writing, and a tunnel barrier layer provided between the first magnetic layer and the second magnetic layer; a first interconnect electrically connected to one of the first and second magnetic layers of the magnetoresistive element; a select transistor, with one of a source and a drain thereof being electrically connected to the other one of the first and second magnetic layers of the magnetoresistive element; a second interconnect electrically connected to the other one of the source and the drain of the select transistor; a diode having one terminal electrically connected to the other one of the first and second magnetic layers of the magnetoresistive element; a third interconnect electrically connected to the other terminal of the diode; and a sense amplifier electrically connected to the third interconnect.

The following is a description of embodiments, with reference to the accompanying drawings. In the following description, components having like functions and structures are denoted by like reference numerals, and explanation of them will be made only if necessary.

First Embodiment

Fundamental Structure

FIG. 1 shows the fundamental structure of a memory cell of a MRAM according to a first embodiment. This memory cell 1 includes a MTJ element 10, a select transistor 20, a diode 25, a writing circuit 51, and a reading circuit 55 including a sense amplifier 40. The MTJ element 10 can be a perpendicular-magnetization spin-injection element that includes a stray field adjusting layer/a nonmagnetic layer/a reference layer/a tunnel barrier layer/a recording layer/a foundation layer, for example. Here, "A/B" means that a layer A is located above a layer B. It should be noted that the MTJ element 10 should include at least a reference layer having a magnetization direction fixed in a direction perpendicular to the film plane, a recording layer having a magnetization direction that is perpendicular to the film plane and is variable, and a tunnel barrier layer provided between the reference layer and the recording layer. Here, the "film plane" means the upper face of each magnetic layer.

The select transistor 20 can be an N-channel MOS (Metal Oxide Semiconductor) transistor, for example. One terminal of the MTJ element 10 is connected to a first interconnect 30a, and the other terminal is connected to one of the source and drain of the select transistor 20 and one terminal of the diode 25. The other one of the source and drain of the select transistor 20 is connected to a second interconnect 30b, and the other terminal of the diode 25 is connected to a third interconnect 30c. A sense amplifier 40 is also connected to the third interconnect 30c.

(Write Method)

Figure 2:
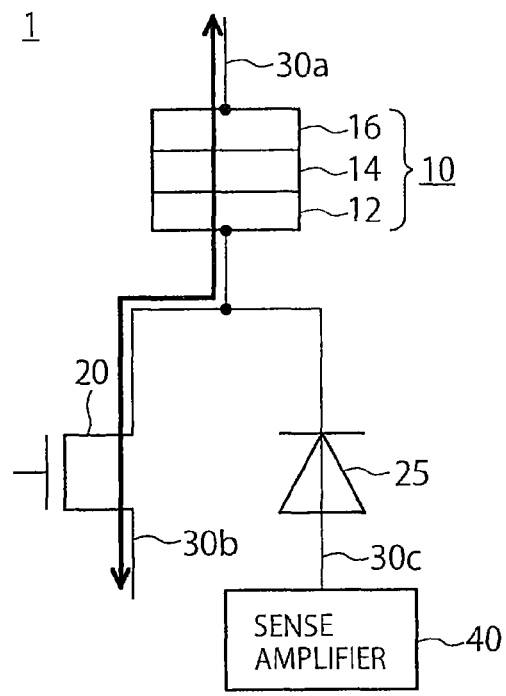
FIG. 2 is a diagram for explaining a write method to be implemented in the memory cell of the first embodiment.

Referring to FIG. 2, a write method to be implemented in the memory cell 1 shown in FIG. 1 is described. In FIG. 2, the MTJ element 10 includes a recording layer 12, a reference layer 16, and a tunnel barrier layer 14 provided between the recording layer 12 and the reference layer 16. The arrows in FIG. 2 indicate the direction of the current flows at the time of writing. The writing is performed by the writing circuit 51.

When writing is to be performed, the select transistor 20 is put into an on state by applying a voltage to the gate electrode of the select transistor 20. In this state, a voltage is applied to each of the first interconnect 30a and the second interconnect 30b, so that a current can flow bidirectionally. In this manner, writing is performed. For example, in a case where the magnetization direction of the recording layer 12 is parallel to (the same as) the magnetization direction of the reference layer 16, writing to switch the magnetization direction of the recording layer 12 to the direction antiparallel to (the opposite direction from) the magnetization direction of the reference layer 16 is carried out by flowing a current from the first interconnect 30a to the second interconnect 30b via the MTJ element 10 and the select transistor 20. In this case, electrons flow from the second interconnect 30b to the recording layer 12 via the select transistor 20. As a result, the electrons are spin-polarized by the recording layer 12, and the spin-polarized electrons travel to the reference layer 16 through the tunnel barrier layer 14. At this point, the electrons having spins oriented in the same direction as the magnetization direction of the reference layer 16 pass through the reference layer 16, and flow into the first interconnect 30a. The electrons having spins oriented in the opposite direction from the magnetization direction of the reference layer 16 are reflected by the interface between the tunnel barrier layer 14 and the reference layer 16. The spin transfer torque then acts on the magnetization of the recording layer 12, and the magnetization direction of the recording layer 12 is reversed. In this manner, writing is performed.

In a case where the magnetization direction of the recording layer 12 is antiparallel to the magnetization direction of the reference layer 16, writing to switch the magnetization direction of the recording layer 12 to the direction parallel to the magnetization direction of the reference layer 16 is performed by flowing a current from the second interconnect 30b to the first interconnect 30a via the select transistor 20 and the MTJ element 10. In this case, electrons flow from the first interconnect 30a to the reference layer 16. As a result, the electrons are spin-polarized by the reference layer 16. The spin-polarized electrons flow into the recording layer 12 via the tunnel barrier layer 14. The spin transfer torque then acts on the magnetization of the recording layer 12, and the magnetization direction of the recording layer 12 is reversed. Accordingly, the magnetization direction of the recording layer 12 is changed from an antiparallel state to a parallel state, and writing is performed.

(Read Method)

Figure 3:
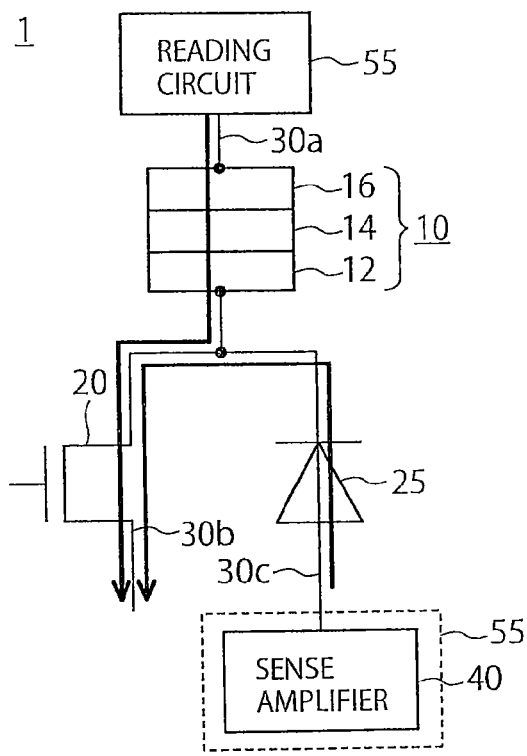
FIG. 3 is a diagram for explaining a read method to be implemented in the memory cell of the first embodiment.

Referring now to FIG. 3, a read method to be implemented in the memory cell 1 shown in FIG. 1 is described. The arrows shown in FIG. 3 indicate the direction of the current flows at the time of reading. The reading is performed by the reading circuit 55.

When reading is to be performed, the select transistor 20 is put into an on state by applying a voltage to the gate electrode of the select transistor 20. In this state, a positive voltage is applied to each of the first interconnect 30a and the third interconnect 30c, so that a ground voltage can be applied to the second interconnect 30b. In spin-injection writing, the spin-injection magnetization switching current is larger in a case where a current is applied from the reference layer 16 to the recording layer 12 than in a case where a current is applied from the recording layer 12 to the reference layer 16. That is, by flowing a read current from the reference layer 16 to the recording layer 12, spin-injection magnetization reversals become difficult, and erroneous writing due to reading can be prevented. Therefore, reading is performed with the sense amplifier 40 reading out the current flowing in the third interconnect 30c connected to the diode 25. In FIG. 3, reading can also be performed by reversing the connection of the diode 25 and reversing the direction of the read current flow. In this case, however, to prevent writing on the recording layer 12 at the time of reading, the stacking order in the MTJ element 10 should preferably be reversed. That is, the recording layer 12 is connected to the first interconnect 30a, and the reference layer 16 is connected to the diode 25 and the select transistor 20.

In a case where the MTJ element 10 has a MR (magnetoresistive) change rate of 200%, if the resistance is 111 kΩ when the magnetization directions of the reference layer 16 and the recording layer 12 are parallel to each other, the resistance is 333 kΩ when the magnetization directions are antiparallel to each other. The resistance of the select transistor 20 is 189 kΩ, a PIN diode is used as the diode 25, and the diode 25 is connected in such a direction that the n-type layer is connected to the select transistor 20 and the MTJ element 10. That is, the path in which a current flows from the third interconnect 30c toward the second interconnect 30b is the forward direction for the diode 25. In a case where a voltage of 0.3 V is applied between the first interconnect 30a and the second interconnect 30b, when the resistance of the MTJ element 10 is 111 kΩ, a voltage of 0.11 V is applied to the MTJ element 10, and a voltage of 0.19 V is applied to the select transistor 20. When the resistance of the MTJ element 10 is 333 kΩ, on the other hand, a voltage of 0.19 V is applied to the MTJ element 10, and a voltage of 0.11 V is applied to the select transistor 20.

In a case where a voltage of 0.3 V is applied between the first interconnect 30a and the second interconnect 30b at the same time as a voltage of 0.3 V is applied between the third interconnect 30c and the second interconnect 30b, the cell structure shown in FIG. 3 can be regarded as a circuit in which the select transistor 20 is connected in series to a parallel circuit formed with the MTJ element 10 and the diode 25. If the resistance of the diode 25 is made sufficiently high with respect to the resistance of the MTJ element 10, a current hardly flows in the diode 25, and a current almost equivalent to the current flowing in the select transistor 20 flows in the MTJ element 10. Since nearly the same amounts of current flow in the MTJ element 10 and the select transistor 20, the voltage to be applied to both ends of the MTJ element 10 and the voltage to be applied to the select transistor 20 can be approximated by the ratio between the resistance of the MTJ element 10 and the resistance of the select transistor 20. As the MTJ element 10 and the diode 25 form a parallel circuit and have voltages with the same potential difference to be applied thereto, the voltage to be applied to the diode 25 is determined by the voltages to be applied to the MTJ element 10 and the select transistor 20. Therefore, in a case where the resistance of the MTJ element 10 is 111 kΩ while the resistance of the select transistor 20 is 189 kΩ, a voltage of 0.11 V is applied to the MTJ element 10, a voltage of 0.19 V is applied to the select transistor 20, and a voltage of 0.11 V, which is the same as the voltage applied to the MTJ element 10, is applied to the diode 25. In a case where the resistance of the MTJ element 10 is 333 kΩ while the resistance of the select transistor 20 is 189 kΩ, on the other hand, a voltage of 0.19 V is applied to the MTJ element 10, a voltage of 0.11 V is applied to the select transistor 20, and a voltage of 0.19 V, which is the same as the voltage applied to the MTJ element 10, is applied to the diode 25.

Figure 4:
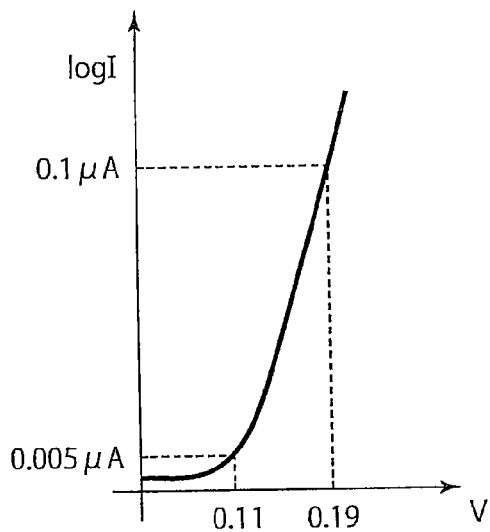
FIG. 4 is a graph showing the I-V characteristics of a PIN diode.

Next, a case where a PIN diode having the I-V characteristics shown in FIG. 4 is used as the diode 25 is described. The I-V characteristics shown in FIG. 4 can be formed in the following manner. SiB is formed by doping p-type Si with B (boron), SiP is formed by doping n-type Si with P (phosphorus), and an insulating film (an i-type layer) is interposed between the p-type semiconductor and the n-type semiconductor. In a case where the voltage applied to the diode 25 is 0.11 V, a current of 0.005 μA flows. In a case where the voltage applied to the diode is 0.19 V, a current of 0.1 μA flows. That is, as the voltage changes 0.08 V, from 0.11 V to 0.19 V, the current increases twenty-fold. In other words, the current flowing between the third interconnect 30c and the second interconnect 30b can be increased about twenty-fold. As for the current flowing between the first interconnect 30a and the second interconnect 30b, in a case where the MTJ element 10 is a low-resistance state, the resistance of the select transistor 20 is 189 kΩ when the resistance of the MTJ element 10 is 111 kΩ, and a current of approximately 1 μA flows between the first interconnect 30a and the second interconnect 30b when a voltage of 0.3 V is applied. In a case where the MTJ element 10 is in a high-resistance state, the resistance of the select transistor 20 is 189 kΩ when the resistance of the MTJ element 10 is 333 kΩ, and a current of approximately 0.57 μA flows between the first interconnect 30a and the second interconnect 30b when a voltage of 0.3 V is applied. That is, the currents flowing between the first interconnect 30a and the second interconnect 30b are 1 μA and 0.57 μA respectively, and a ratio of approximately 1.7-fold can be obtained. While the current flowing between the first interconnect 30a and the second interconnect 30b is increased 1.7-fold, the current flowing between the third interconnect 30c and the second interconnect 30b can be increased 20-fold. Accordingly, a high current ratio can be achieved by connecting the diode 25 to the cell structure formed with the MTJ element 10 and the select transistor 20, and reading the current flowing in the diode 25 and the select transistor 20. In conventional cases, a read current ratio of only approximately 2-fold was obtained in a cell structure formed by combining a MTJ element 10 and a select transistor 20. In this embodiment, however, the read current can be increased more than 10 times, since the diode 25 is incorporated into the structure.

In practice, the MTJ element 10 is connected in parallel to the diode 25, and the voltages to be applied to the diode 25 and the MTJ element 10 are determined by the ratio between the resistance of the select transistor 20 and the combined resistance of the diode 25 and the MTJ element 10. Accordingly, the change in voltage caused when the resistance of the MTJ element 10 changes from 111 kΩ to 333 kΩ varies with the on-state resistance and off-state resistance of the diode 25. When the reading from the memory cell 1 as illustrated in FIG. 3 is performed using a diode with the characteristics shown in FIG. 4, the current flowing in the diode 25 increases nineteen-fold, which is slightly smaller than the above described twenty-fold increase as the change amount of the current flowing between the third interconnect 30c and the second interconnect 30b.

The change in the amount of the current flowing in the diode 25 is determined by the resistances of the MTJ element 10, the select transistor 20, and the diode 25. A larger change in the amount of the current flowing in the diode 25 is more preferable. To increase the change in the amount of the current flowing in the diode 25, the resistance values in the diode 25, the MTJ element 10, and the select transistor 20 need to be optimized.

Figure 5:
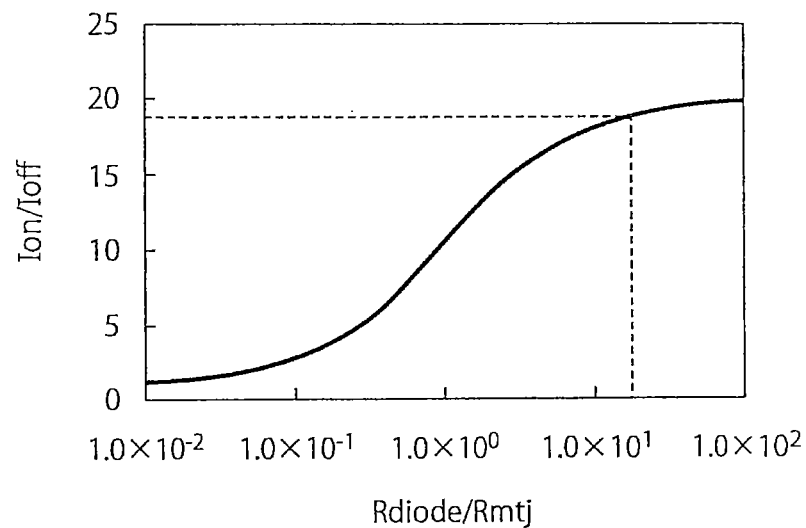
FIG. 5 is a graph showing the current that flows in the diode when the reading from the memory cell of the first embodiment is performed with the diode having the characteristics shown in FIG. 4.

FIG. 5 shows the change in the amount of the current flowing in the diode 25 in a case where the reading from the memory cell 1 is performed as shown in FIG. 3. In FIG. 5, Rdiode on the abscissa axis represents the resistance of the diode 25 in the on-state, and Rmtj represents the resistance of the MTJ element 10 in the low-resistance state. Ion on the ordinate axis represents the current that flows in the diode 25 when the resistance of the MTJ element 10 is high (333 kΩ), and Ioff represents the current that flows in the diode 25 when the resistance of the MTJ element 10 is low (111 kΩ). Where a diode having the characteristics shown in FIG. 4 is used, resistance values are selected so that the resistance of the MTJ element 10 in the low-resistance state is 111 kΩ, and the resistance of the diode 25 in the on state is 1.9 MΩ. That is, resistance values are selected so that Rdiode/Rmtj becomes 1.7. In this manner, the current flowing in the diode 25 can be increased nineteen-fold when the diode 25 is switched from the off state to the on state (see the dashed line in FIG. 5).

As described above, in a case where a memory cell is formed with the MTJ element 10 and the select transistor 20, and where the MTJ element 10 is in the low-resistance state, the resistance of the select transistor 20 is 189 kΩ while the resistance of the MTJ element 10 is 111 kΩ. When a voltage of 0.3 V is applied, a current of approximately 1 μA flows. In a case where the MTJ element 10 is in the high-resistance state, the resistance of the select transistor 20 is 189 kΩ, while the resistance of the MTJ element 10 is 333 kΩ. When a voltage of 0.3 V is applied, a current of approximately 0.57 μA flows. That is, the currents flowing in the memory cell formed with the MTJ element 10 and the select transistor 20 are 1 μA and 0.57 μA, respectively, and a rate of approximately 1.7-fold can be achieved according to the equation: 1 µA/0.57 µA=1.7. The flowing current increases 1.7 times when the MTJ element 10 is switched from the low-resistance state to the high-resistance state. In a case where the diode 25 is used, on the other hand, a nineteen-fold increase can be achieved. Accordingly, by using the diode 25, a larger change in the current amount can be achieved, and adverse influence of a current change rate due to an RC delay in high-speed reading can be compensated.

FIG. 5 shows that the ratio of the read current flowing in the diode 25 varies with the ratio between the magnitude of the resistance of the diode 25 and the magnitude of the resistance of the MTJ element 10. By increasing the resistance of the diode 25 with respect to the resistance of the MTJ element 10, a high current ratio can be achieved. Therefore, where Rdiode represents the resistance of the diode 25 while Rmtj represents the resistance of the MTJ element 10, the design is preferably performed so as to satisfy the relationship Rdiode>Rmtj.

Figure 6:
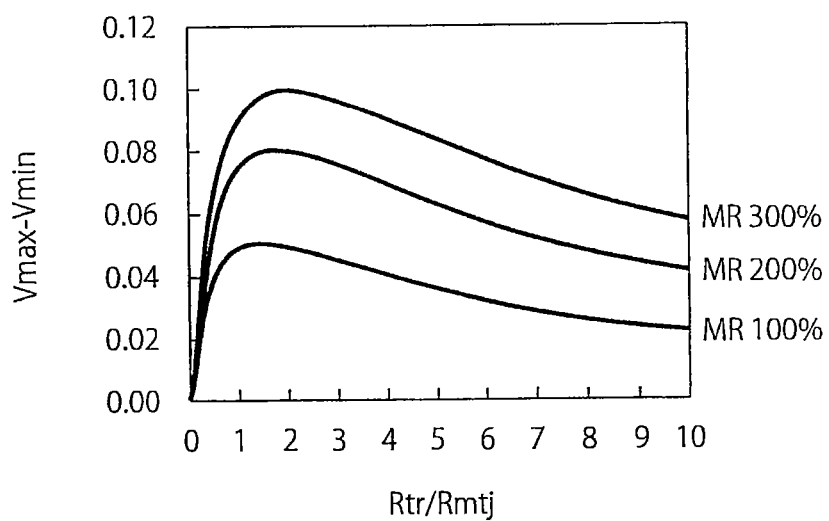
FIG. 6 is a graph showing the dependency of the differences in the voltage to be applied to the MTJ element on the ratio of the resistance Rtr of the select transistor to the resistance Rmtj of the MTJ element.
Figure 7:
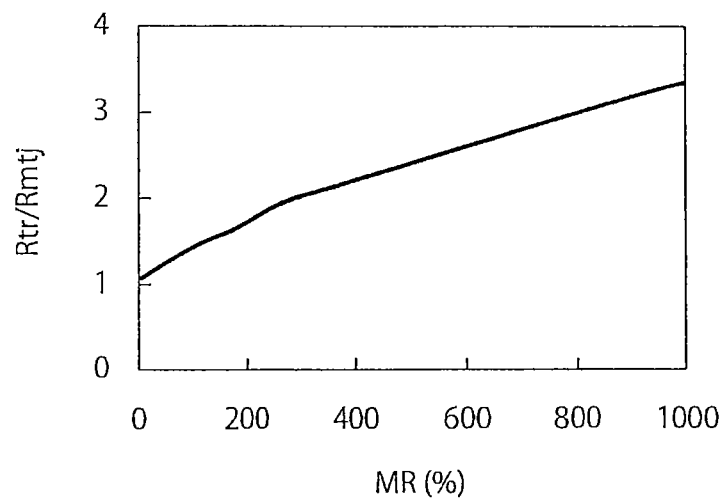
FIG. 7 is a graph showing the ratio between the resistance of the select transistor and the resistance of the MTJ element.

To increase the ratio of the current flowing in the diode 25, it is preferable to increase the difference in the voltage to be applied to the diode 25 between the on state and the off state. The difference in the voltage to be applied to the diode 25 can be increased by increasing the difference in the voltage to be applied to the MTJ element 10. FIG. 6 shows differences in the voltage to be applied to the MTJ element 10. In FIG. 6, the abscissa axis indicates ratios between the on-state resistance Rtr of the select transistor 20 and the low-resistance value Rmtj of the MTJ element 10 (=Rtr/Rmtj), and the ordinate axis indicates the differences between the maximum voltage Vmax and the minimum voltage Vmin to be applied to the MTJ element 10. The difference (Vmax−Vmin) in the voltage to be applied to the MTJ element 10 is determined by the ratio of the resistance Rtr of the select transistor 20 to the resistance Rmtj of the MTJ element 10 (=Rtr/Rmtj), and the MR change rate. In a case where the MR change rate is 200%, a resistance difference of 0.8 V is obtained by making the resistance Rtr of the select transistor 20 1.7 times higher than the resistance Rmtj of the MTJ element 10, for example. FIG. 7 shows the ratio between the resistance of the select transistor 20 and the resistance of the MTJ element 10, with which the resistance difference in the MTJ element 10 becomes largest with respect to the MR change rate in the MTJ element 10. As can be seen from FIG. 7, where Rmtj represents the resistance of the MTJ element 10 while Rtr represents the resistance of the select transistor 20, the design is preferably performed so as to satisfy the relationship Rtr>Rmtj, or the MR change rate is preferably increased as high as possible.

As can be seen from FIGS. 5 and 7, to increase the ratio of the current flowing in the diode 25 between the on state and the off state, the on-state resistance Rdiode of the diode 25 is preferably made higher than the low-resistance value Rmtj of the MTJ element 10, and the on-state resistance Rtr of the select transistor 20 is preferably made higher than the low-resistance value Rmtj of the MTJ element 10. Also, the on-state resistance of the diode 25 is preferably made higher than the high-resistance value of the MTJ element 10.

Figure 8:
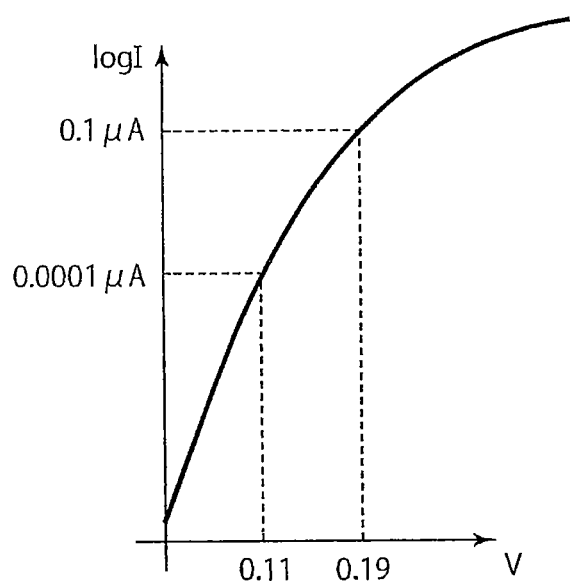
FIG. 8 is a graph showing the I-V characteristics of a SIM schottky diode.

Next, an example case where a schottky diode having the I-V characteristics shown in FIG. 8 is used as the diode 25 is described. This schottky diode can be formed by bonding NiSi to Si, for example. Since the current change with respect to a small amount of voltage can be made larger by using a schottky diode, the current ratio between Ion and Ioff can be made higher by using the schottky diode illustrated in FIG. 8 as the diode 25 of the memory cell illustrated in FIG. 2. Other than a junction of a semiconductor and a metal, a MIM (Metal Insulator Metal) structure having an insulator interposed between conductive films can be used as the schottky diode.

Although a PIN diode has been described as the diode 25 of the memory cell illustrated in FIG. 2, a PN diode formed by bonding GeAs to Ge or a Zener diode can be used, instead of the PIN diode. In a case where a Zener diode is used, however, the positions of P and N need to be reversed in the memory cell illustrated in FIG. 2.

The voltages to be applied to the MTJ 10 and the diode 25 are the same in the above description. However, the voltage to be applied to the diode 25 can be made higher than the voltage to be applied to the MTJ element 10. By creating a difference between the voltage to be applied to the MTJ element 10 and the voltage to be applied to the diode 25, the current flowing in the diode 25 can be increased, and the read output with respect to the sense amplifier for reading can be increased. Also, as the resistance of the diode 25 can be made lower, degradation of the rise of the pulse current due to a RC delay in an interconnect can be restrained, and reading can be performed at higher speeds.

As described so far, the first embodiment can provide a magnetic memory that enables high-speed operations.

Second Embodiment

Figure 9:
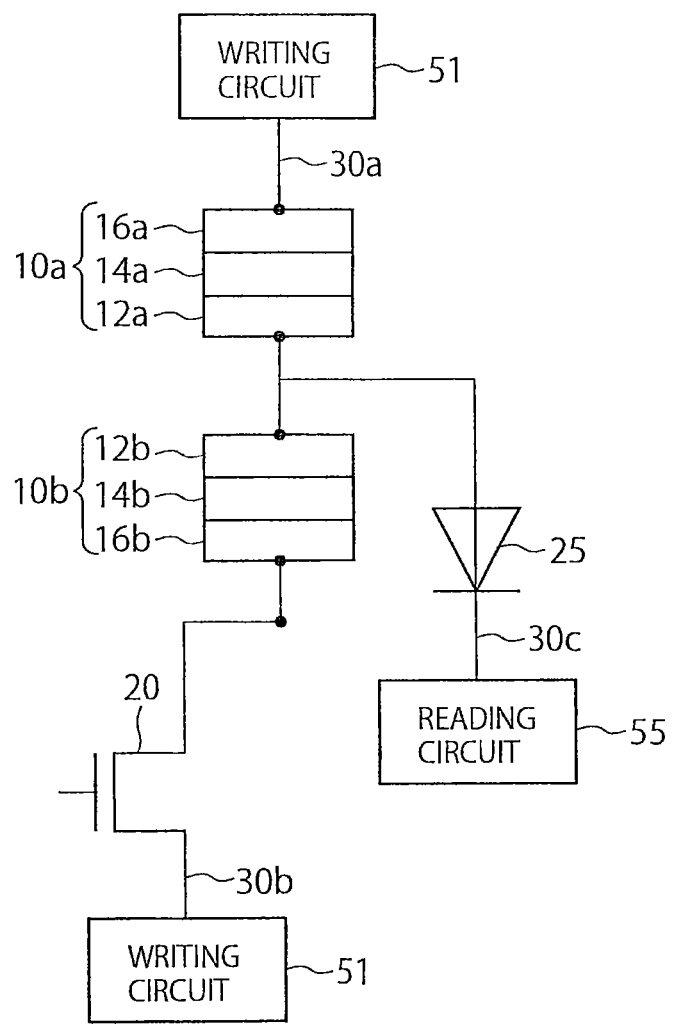
FIG. 9 is a diagram showing a memory cell of a MRAM according to a second embodiment.

FIG. 9 shows the fundamental structure of a memory cell of a MRAM according to a second embodiment. This memory cell 1 includes two MTJ elements 10a and 10b, a select transistor 20, a diode 25, a writing circuit 51, and a reading circuit 55 including a sense amplifier 40. The MTJ element 10a includes at least a recording layer 12a, a reference layer 16a, and a tunnel barrier layer 14a provided between the recording layer 12a and the reference layer 16a. The MTJ element 10b includes at least a recording layer 12b, a reference layer 16b, and a tunnel barrier layer 14b provided between the recording layer 12b and the reference layer 16b. One terminal (or the electrode (not shown) on the side of the reference layer 16a) of the MTJ element 10a is connected to a first interconnect 30a, and the other terminal (or the electrode (not shown) on the side of the recording layer 12a) is connected to one terminal (the electrode (not shown) on the side of the recording layer 12b) of the MTJ element 10b, and to one terminal of the diode 25. The other terminal (or the electrode (not shown) on the side of the reference layer 16b) of the MTJ element 10b is connected to one of the source and drain of the select transistor 20. The other one of the source and drain of the select transistor 20 is connected to a second interconnect 30b, and the other terminal of the diode 25 is connected to a third interconnect 30c. A sense amplifier 40 is also connected to the third interconnect 30c. That is, in the memory cell of the MRAM according to the second embodiment, one terminal of the diode 25 is connected to the recording layers 12a and 12b of the two MTJ elements 10a and 10b. The recording layer 12a and the recording layer 12b are connected to each other via an interconnect or a nonmagnetic conductive layer. The recording layer 12a and the recording layer 12b have the same magnetization directions. Meanwhile, the magnetization directions of the reference layer 16a and the reference layer 16b are antiparallel to each other.

Figure 10:
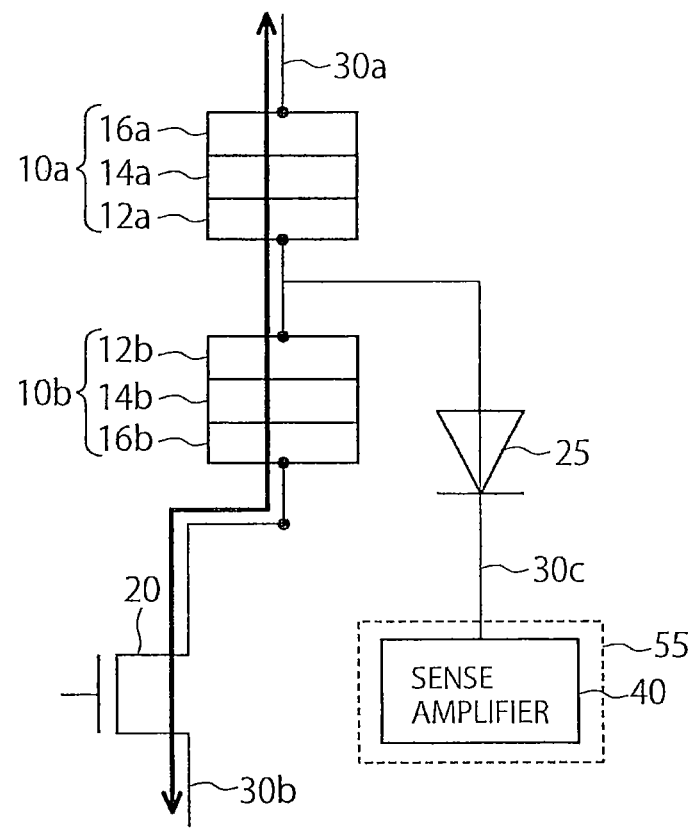
FIG. 10 is a diagram for explaining a write method to be implemented in the memory cell of the second embodiment.
Figure 11:
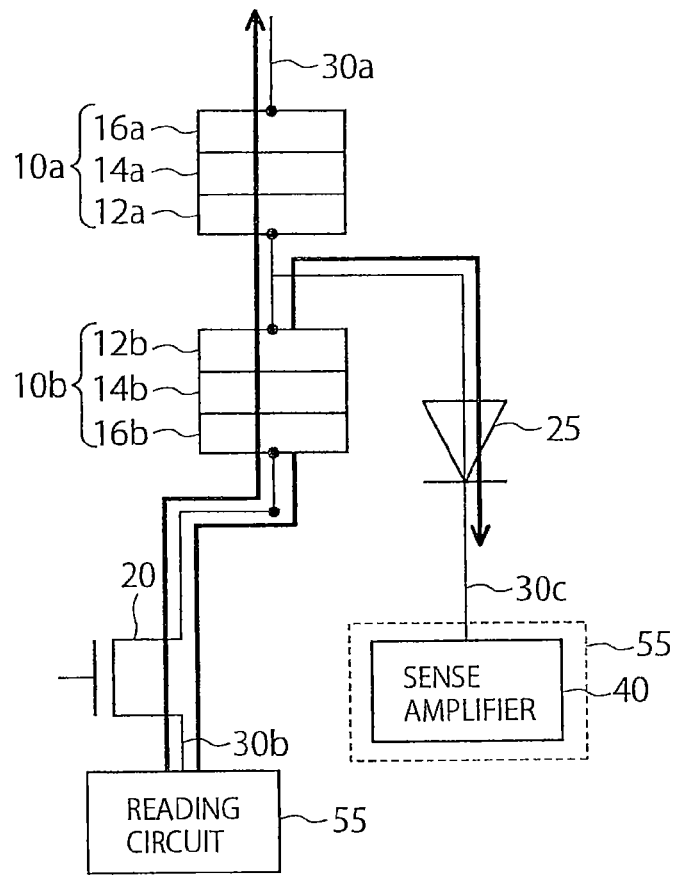
FIG. 11 is a diagram for explaining a read method to be implemented in the memory cell of the second embodiment.

In the following, a write method to be implemented in the memory cell having the above structure according to the second embodiment is described, with reference to FIG. 10. A read method to be implemented in the memory cell having the above structure according to the second embodiment is described, with reference to FIG. 11. The arrows shown in FIGS. 10 and 11 indicate the flows of electrons.

(Write Method)

When writing is to be performed, the select transistor 20 is put into an on state by applying a voltage to the gate electrode of the select transistor 20. In this state, a voltage is applied to each of the first interconnect 30a and the second interconnect 30b, so that a current can flow bidirectionally. In this manner writing is performed by the writing circuit 51.

For example, in a case where the magnetization directions of the recording layers 12a and 12b are parallel to the magnetization direction of the reference layer 16a while the magnetization directions of the recording layers 12a and 12b are antiparallel to the magnetization direction of the reference layer 16b, writing to switch the magnetization direction of the recording layer 12a to the direction antiparallel to the magnetization direction of the reference layer 16a is performed by flowing a current from the first interconnect 30a to the second interconnect 30b via the MTJ elements 10a and 10b and the select transistor 20. In this case, electrons flow from the second interconnect 30b to the reference layer 16b via the select transistor 20. In the MTJ element 10b, electrons are spin-polarized while passing through the reference layer 16b. The spin-polarized electrons then flow into the recording layer 12b via the tunnel barrier layer 14b. The spin transfer torque acts on the magnetization of the recording layer 12b, and the magnetization direction of the recording layer 12b is reversed. As a result, the magnetization direction of the recording layer 12b is switched from an antiparallel state to a parallel state with respect to the magnetization direction of the reference layer 16b. In this manner, writing is performed. Meanwhile, in the MTJ element 10a, electrons flow from the MTJ element 10b to the recording layer 12a. The electrons are then spin-polarized by the recording layer 12a, and the spin-polarized electrons travel to the reference layer 16a through the tunnel barrier layer 14a. At this point, the electrons having spins oriented in the same direction as the magnetization direction of the reference layer 16a pass through the reference layer 16a and flow into the first interconnect 30a. The electrons having spins oriented in the opposite direction to the magnetization direction of the reference layer 16a are reflected by the interface between the tunnel barrier layer 14a and the reference layer 16a. The spin transfer torque then acts on the magnetization of the recording layer 12a, and the magnetization direction of the recording layer 12a is reversed. In this manner, writing is performed.

In a case where the magnetization directions of the recording layers 12a and 12b are antiparallel to the magnetization direction of the reference layer 16a while the magnetization directions of the recording layers 12a and 12b are parallel to the magnetization direction of the reference layer 16b, writing to switch the magnetization direction of the recording layer 12a to the direction parallel to the magnetization direction of the reference layer 16a is performed by flowing a current from the second interconnect 30b to the first interconnect 30a via the select transistor 20 and the MTJ elements 10a and 10b. In this case, electrons flow from the first interconnect 30a to the reference layer 16a. In the MTJ element 10a, electrons are spin-polarized by the reference layer 16a. The spin-polarized electrons then flow into the recording layer 12a via the tunnel barrier layer 14a. The spin transfer torque acts on the magnetization of the recording layer 12a, and the magnetization direction of the recording layer 12a is reversed. As a result, the magnetization direction of the recording layer 12a is switched from an antiparallel state to a parallel state. In this manner, writing is performed. Meanwhile, in the MTJ element 10b, electrons flow from the MTJ element 10a to the recording layer 12b. The electrons are then spin-polarized by the recording layer 12b, and the spin-polarized electrons travel to the reference layer 16b through the tunnel barrier layer 14b. At this point, the electrons having spins oriented in the same direction as the magnetization direction of the reference layer 16b pass through the reference layer 16b and flow into the second interconnect 30b. The electrons having spins oriented in the opposite direction to the magnetization direction of the reference layer 16b are reflected by the interface between the tunnel barrier layer 14b and the reference layer 16b. The spin transfer torque then acts on the magnetization of the recording layer 12b, and the magnetization direction of the recording layer 12b is reversed. In this manner, writing is performed.

(Read Method)

When reading is to be performed, the select transistor 20 is put into an on state by applying a voltage to the gate electrode of the select transistor 20. In this state, a ground voltage is applied to each of the first interconnect 30a and the third interconnect 30c, and a positive voltage is applied to the second interconnect 30b. The current flowing in the third interconnect 30c connected to the diode 25 is then read with the sense amplifier 40, as in the first embodiment. In this manner, reading is performed by the reading circuit 55.

Figure 12:
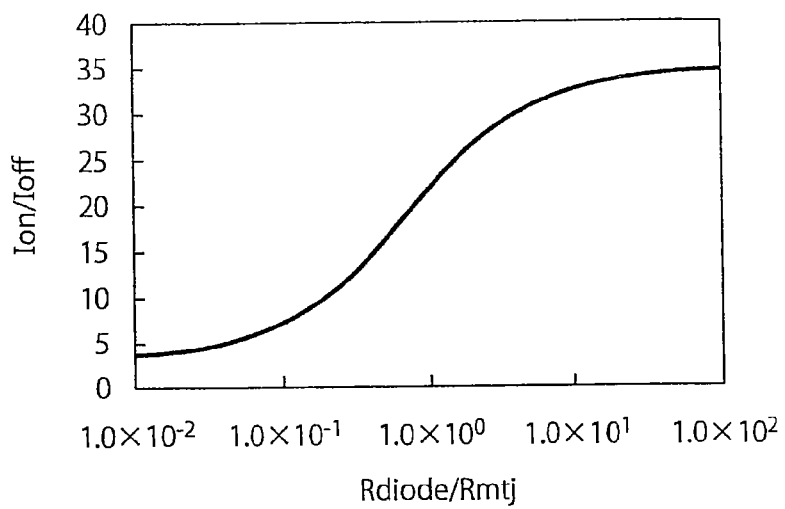
FIG. 12 is a graph showing the dependency of the current ratio between a current Ion and a current Ioff flowing in the diode on the ratio Rdiode/Rmtj.

FIG. 12 shows the dependency of the current ratio between the current Ion flowing when the diode 25 is in the on state and the current Ioff flowing when the diode 25 is in the off state (=Ion/Ioff) on the ratio Rdiode/Rmtj in a case where the memory cell of the second embodiment illustrated in FIG. 9 is used. The characteristics shown in FIG. 12 were obtained where elements having the same performances as those of the MTJ element, the diode, and the select transistor used in FIG. 5 were used. By using the memory cell illustrated in FIG. 9, the ratio between the current Ion flowing in the diode 25 and the current Ioff flowing in the diode 25 can be made even higher. Furthermore, as can be seen from FIG. 12, a read current ratio of 20-fold or higher can be achieved where the resistance Rdiode of the diode 25 and the resistance Rmtj of the MTJ elements 10a and 10b satisfy the relationship Rdiode>0.9×Rmtj. With this arrangement, the read current flowing in the diode 25 can be increased. As a result, degradation of the rise of the pulse current due to a RC delay in an interconnect can be restrained, and reading can be performed at higher speeds.

As described above, the second embodiment can provide a magnetic memory that enables high-speed operations.

Figure 13:
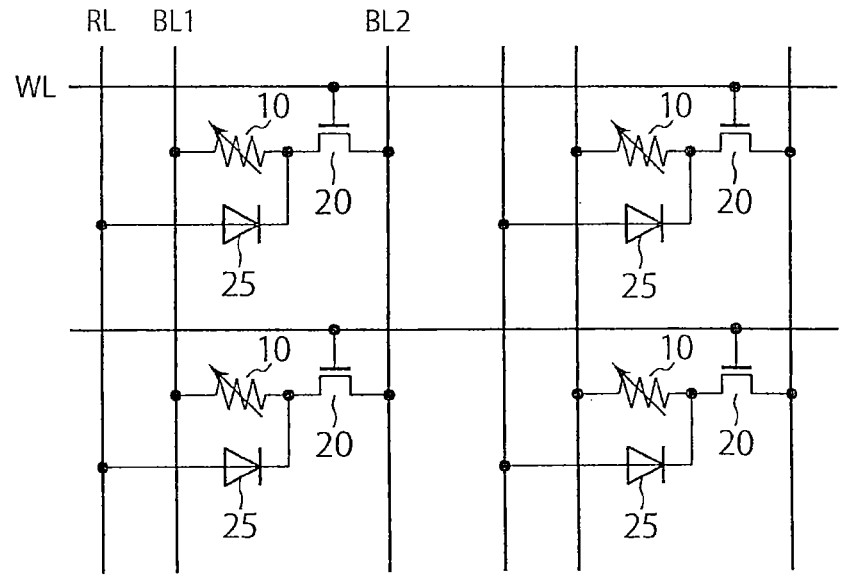
FIG. 13 is a circuit diagram showing a first specific example of a layout of memory cells according to the first embodiment.
Figure 14:
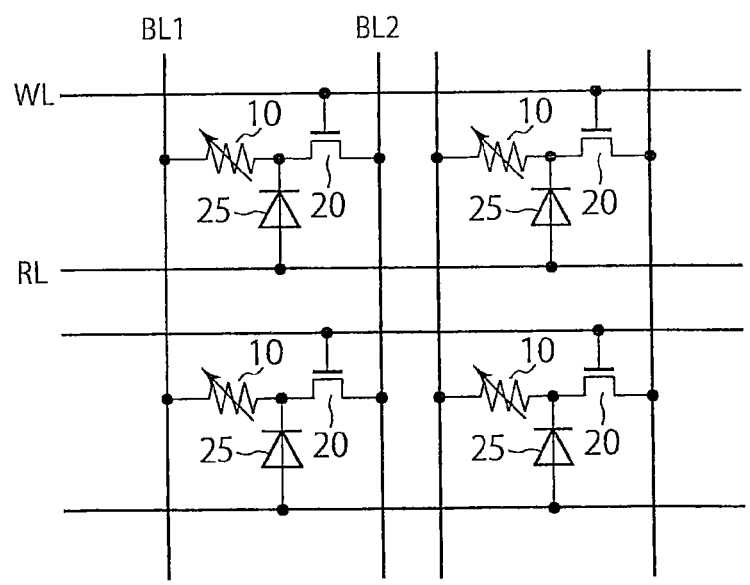
FIG. 14 is a circuit diagram showing a second specific example of a layout of memory cells according to the first embodiment.

FIGS. 13 and 14 show first and second specific examples of layouts of memory cells according to the first embodiment.

In the first specific example illustrated in FIG. 13, one terminal of each MTJ element 10 is connected to a first bit line (a first interconnect) BL1, and the other terminal is connected to one of the source and drain of the select transistor 20. The other one of the source and drain of the select transistor 20 is connected to a second bit line (a second interconnect) BL2, and the gate of the select transistor 20 is connected to a word line WL. The anode of the diode 25 is connected to the other terminal of the MTJ element 10, and the cathode of the diode 25 is connected to a read interconnect RL. A sense amplifier (not shown) is also connected to the read interconnect (a third interconnect) RL.

In the second specific example illustrated in FIG. 14, one terminal of each MTJ element 10 is connected to a first bit line BL1, and the other terminal is connected to one of the source and drain of the select transistor 20. The other one of the source and drain of the select transistor 20 is connected to a second bit line BL2, and the gate of the select transistor is connected to a word line WL. The anode of the diode 25 is connected to a read interconnect RL, and the cathode of the diode 25 is connected to the other terminal of the MTJ element 10. A sense amplifier (not shown) is also connected to the read interconnect RL, as in the first specific example.

Figure 15:
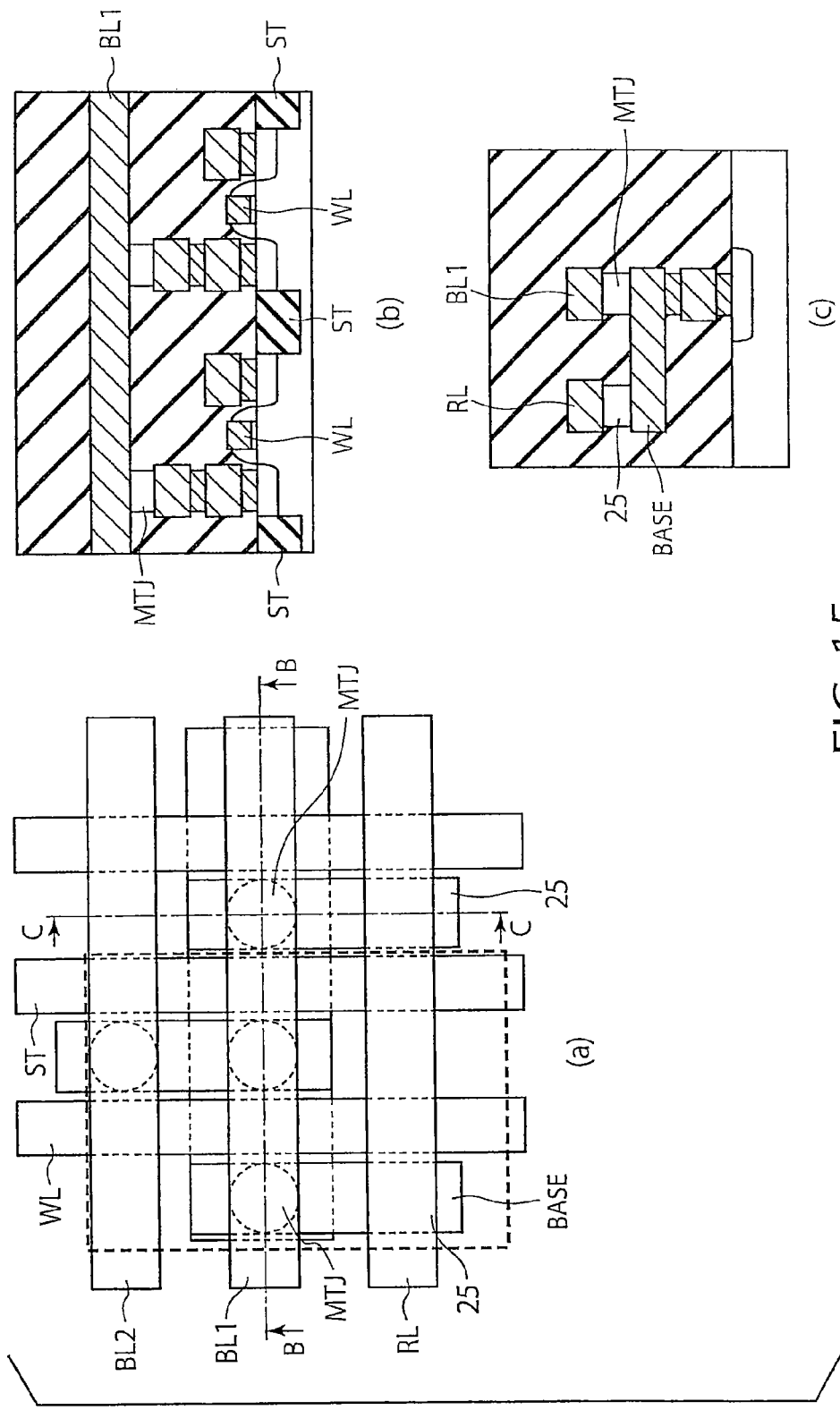
FIGS. 15(a), 15(b), and 15(c) are diagrams for explaining an example of a layout of memory cells according to the first embodiment.

FIG. 15(a) shows an example layout of memory cells of the first embodiment. FIG. 15(b) is a cross-sectional view, taken along the section line B-B defined in FIG. 15(a). FIG. 15(c) is a cross-sectional view, taken along the section line C-C defined in FIG. 15(a).

If the memory cells are arranged as shown in FIGS. 15(a), 15(b), and 15(c), a cell area of 24 $F^2$ can be achieved. Here, F represents the minimum processing size. Where the cell area of a SRAM is assumed to be 130 $F^2$ to 140 $F^2$, the cell area can be reduced to approximately one fifth, and nonvolatile properties can be further added to a large-capacity SRAM. In FIGS. 15(a), 15(b), and 15(c), the size is 24 $F^2$, because bit lines BL1 and BL2 and a read interconnect RL are arranged in the same plane. However, if the bit line BL1, the bit line BL2, and the read interconnect RL are arranged in separate planes, the size can be 8 $F^2$, and higher integration becomes possible.

Figure 16:
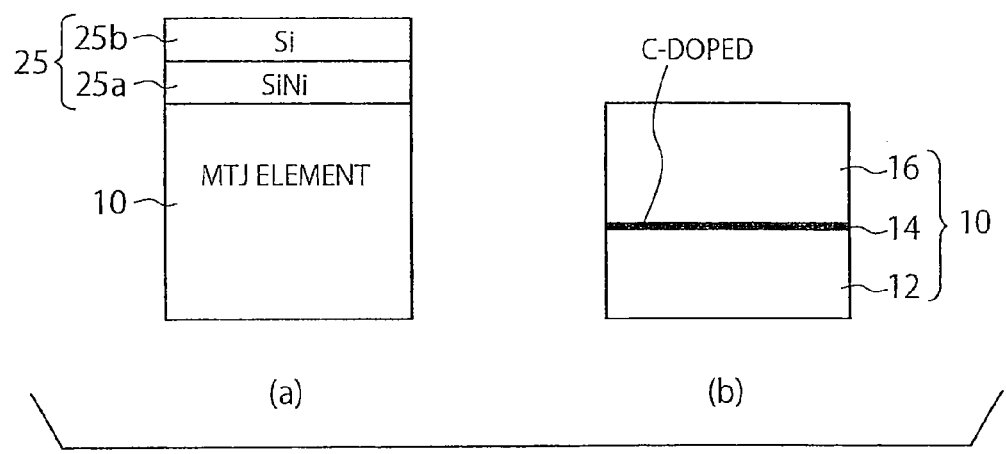
FIGS. 16(a) and 16(b) are diagrams for explaining examples of diodes.

The diodes 25 shown in FIGS. 15(a), 15(b), and 15(c) can be any of PN diodes, Zener diodes, PIN diodes, MIM junctions, or schottky diodes. In a case where schottky diodes are used, for example, as the diode, a diode 25 formed with a SiNi layer 25a and a Si layer 25b as shown in FIG. 16(a) is used. With this arrangement, diodes can be formed in the same plane as the MTJ elements, and the number of lithography processes required for manufacturing the diodes can be reduced. Accordingly, the production costs can be lowered. Alternatively, in a case where MIM junctions are used as diodes, each MTJ element 10 can be doped with C (carbon), to change the insulating properties of the tunnel barrier layer 14. In this manner, diodes can be formed. In this case, diodes can also be formed in the same plane as the MTJ elements, and the number of lithography processes required for manufacturing the diodes can be reduced. Accordingly, the production costs can be lowered. However, the portions of the MTJ elements to be turned into diodes need to be smaller than the device size of each of the MTJ elements.

Alternatively, PN diodes can be formed by flowing a current from the gate electrode of each select transistor to the drain region thereof. In that case, the parasitic resistance of each of the gate electrodes connected to the diodes to be used for reading needs to be lowered. Therefore, the resistances of the gate electrodes need to be lowered.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic memory comprising:
   a memory cell, the memory cell comprising:
   a magnetoresistive element including a first magnetic layer having a magnetization direction not to be changeable, a second magnetic layer having a magnetization direction to be changeable, and a tunnel barrier layer provided between the first magnetic layer and the second magnetic layer;
   a first bit line electrically connected to one of the first and second magnetic layers of the magnetoresistive element;
   a select transistor, with one of a source and a drain thereof being electrically connected to the other one of the first and second magnetic layers of the magnetoresistive element;
   a second bit line electrically connected to the other one of the source and the drain of the select transistor;
   a diode having one terminal electrically connected to the other one of the first and second magnetic layers of the magnetoresistive element; and
   a read interconnect electrically connected to the other terminal of the diode; and
   a sense amplifier electrically connected to the read interconnect.

2. The memory according to claim 1, wherein the following relationships are satisfied:
   R3>R1 and R2>R1
   where R1 represents a resistance of the magnetoresistive element in a low-resistance state at a time of reading, R2 represents a resistance of the select transistor at the time of reading, and R3 represents an on-state resistance of the diode at the time of reading.

3. The memory according to claim 1, wherein the first magnetic layer of the magnetoresistive element is electrically connected to the first bit line, and the second magnetic layer of the magnetoresistive element is electrically connected to a cathode of the diode.

4. The memory according to claim 1, wherein the second magnetic layer of the magnetoresistive element is electrically connected to the first bit line, and the first magnetic layer of the magnetoresistive element is electrically connected to an anode of the diode.

5. The memory according to claim 1, further comprising:
   a reading circuit performing reading by flowing a current between the first bit line and the second bit line, flowing a current between the read interconnect and the second bit line, and detecting a current flowing in the diode with the sense amplifier.

6. The memory according to claim 5, further comprising:
   a writing circuit performing writing by flowing a current between the first bit line and the second bit line.

7. A magnetic memory comprising:
   a first magnetoresistive element including a first magnetic layer having a magnetization direction not to be changeable, a second magnetic layer having a magnetization direction to be changeable, and a first tunnel barrier layer provided between the first magnetic layer and the second magnetic layer;
   a first interconnect electrically connected to the first magnetic layer of the first magnetoresistive element;
   a second magnetoresistive element including a third magnetic layer having a magnetization direction not to be changeable, a fourth magnetic layer having a magnetization direction to be changeable, the fourth magnetic layer being electrically connected to the second magnetic layer, and a second tunnel barrier layer provided between the third magnetic layer and the fourth magnetic layer;
   a select transistor, with one of a source and a drain thereof being electrically connected to the third magnetic layer of the second magnetoresistive element;
   a second interconnect electrically connected to the other one of the source and the drain of the select transistor;
   a diode having one terminal electrically connected to the second magnetic layer of the first magnetoresistive element and the fourth magnetic layer of the second magnetoresistive element;

a third interconnect electrically connected to the other terminal of the diode; and a sense amplifier electrically connected to the third interconnect.

8. The memory according to claim 7, further comprising:

a reading circuit performing reading by flowing a current between the first interconnect and the second interconnect, flowing a current between the third interconnect and the second interconnect, and detecting a current flowing in the diode with the sense amplifier.

9. The memory according to claim 8, further comprising:

a writing circuit performing writing by flowing a current between the first interconnect and the second interconnect.

* * * * *